April 23, 1968 W. K. VOLKERS 3,379,987

ADMITTANCE NEUTRALIZER

Filed Jan. 29, 1964 2 Sheets-Sheet 1

INVENTOR.
WALTER K. VOLKERS

BY Darby & Darby
ATTORNEYS

April 23, 1968 W. K. VOLKERS 3,379,987

ADMITTANCE NEUTRALIZER

Filed Jan. 29, 1964 2 Sheets-Sheet 2

INVENTOR.
WALTER K. VOLKERS

BY *Darby + Darby*

ATTORNEYS

United States Patent Office 3,379,987

Patented Apr. 23, 1968

3,379,987

ADMITTANCE NEUTRALIZER

Walter K. Volkers, Sands Point, N.Y., assignor to Micronia Amplifier Corp., Sands Point, N.Y., a corporation of New York Filed Jan. 29, 1964, Ser. No. 340,906

10 Claims. (Cl. 330—17)

Figure 1:
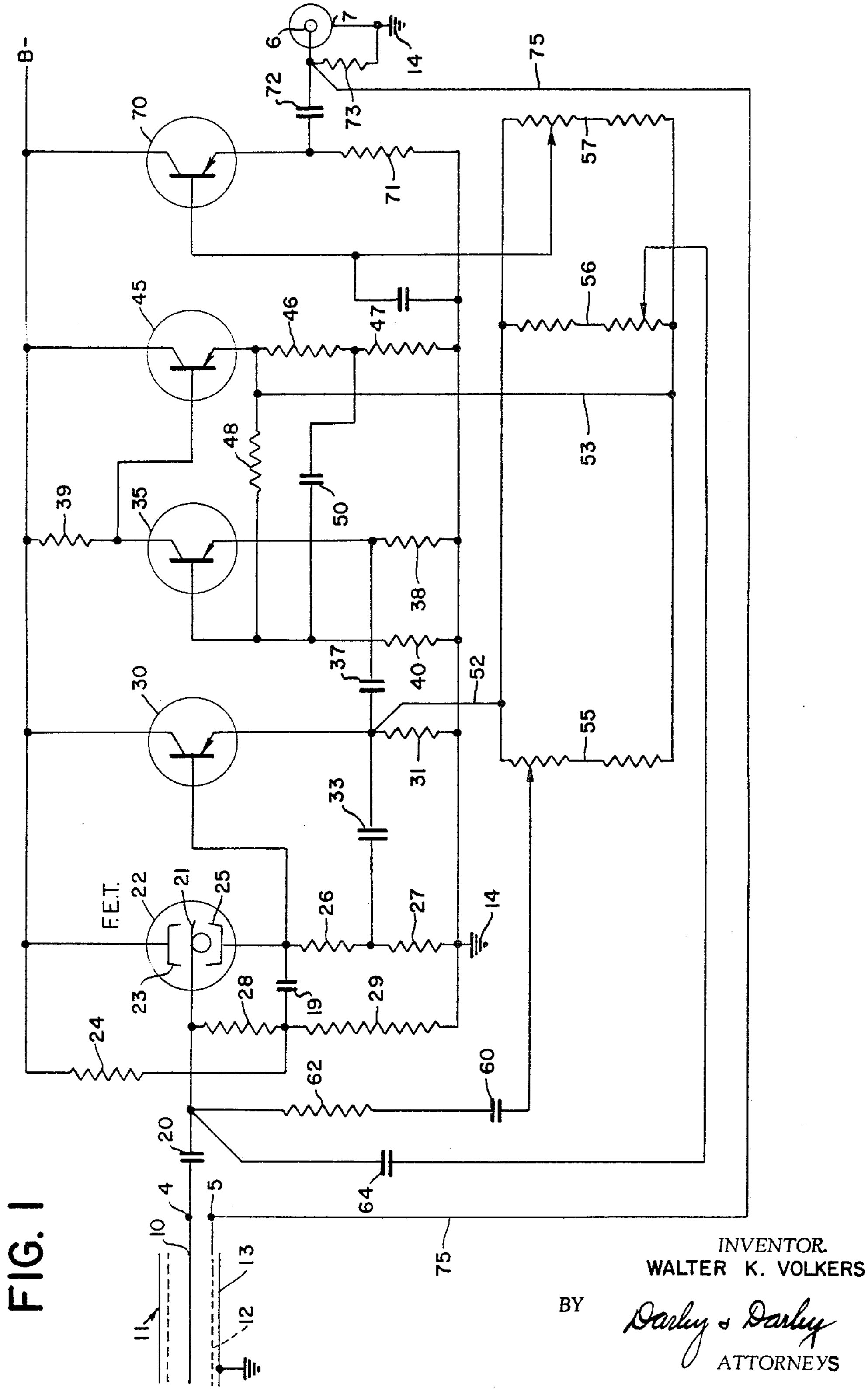

This invention relates to amplifier circuits and more particularly to an amplifier circuit having low input admittance which is useful for connecting high output impedance signal sources to low input impedance equipment.

In the field of electrical measurements, it is well known that the input resistance or impedance of a voltage and/or current measuring instrument should be many times higher than the output resistance or impedance of the signal source whose voltage and/or current is to be measured. The main reason for this is that the use of a measuring device whose input impedance is substantially the same, or only several times greater than the output impedance of the signal source, introduces measuring errors due to circuit loading. Also, when even a small amount of capacitance is present in the input circuit of the measuring device, the frequency response of the device is limited thereby affecting the accuracy of measurement of higher frequency alternating current signals.

The present invention relates to an amplifier circuit which acts as an admittance neutralizer to achieve relatively high, or substantially infinite, or even negative input impedance operation for various measuring devices such as vacuum tube voltmeters and oscilloscopes. The circuit of the invention may also be used as a high impedance input circuit for another amplifier or for other types of electronic equipment.

In accordance with the invention, an amplifier circuit is provided which has a very high input resistance and a very low input capacitive reactance. This means that the input admittance of the amplifier, which is the reciprocal of the input impedance, approaches zero. The accomplishment of the near zero input admittance is brought about by the use of an amplifier circuit whose first stage is a high impedance device such as a vacuum tube, an electrometer tube, or semiconductor device.

In accordance with the present invention an admittance neutralizer is provided which has an amplifier input stage whose input impedance is increased by the use of biasing "pampering" techniques on the bias circuits of the stage. The input circuit of the amplifier stage is also provided with a regenerative feedback signal version of the input signal to the stage to neutralize the input signal currents. This serves to reduce the impedance loading effects of the input signal so that a high input impedance, or substantially zero input admittance, can be produced.

In a preferred embodiment of the invention a semiconductor device of the type called a field effect transistor is utilized. As is known, devices of this general type, including field effect transistors, have very high input resistance, in the order of several hundreds of megohms and above. These devices also have very low input capacity. In the present invention, the input resistance of the admittance neutralizer's first stage is further increased by the use of degenerative or negative feedback which also contributes to its stability of operation. In addition, an amount of regenerative feedback in a controlled range is provided to unload the input of the amplifier circuit and the first stage. This regenerative feedback neutralizes the admittance components produced by the input signal and further decreases the circuit input admittance. For all practical purposes the circuit of the present invention is capable of presenting an infinite impedance (zero admittance) to most signal sources so that there is no loading of the signal source to introduce measurement errors.

The present invention also has a stable post amplifier circuit for adjustably producing an output signal in a controlled range of amplitudes between slightly below and moderately above the amplitude of the input signal. This permits the circuit to serve as a unity or higher gain amplifier. Where a cable is to be used to connect the circuit to the signal source, the cable is provided with a driven shield arrangement utilizing the post amplifier's output signal to decrease its input capacity. This also decreases the input admittance of the circuit. In some applications the presence of the post amplifier permits the circuit to be used to compensate impedances introduced by external devices.

It is therefore an object of the present invention to provide an admittance neutralizer.

A further object of the invention is to provide an amplifier circuit having very low input admittance.

Still another object of the invention is to provide an admittance neutralizer having a field effect transistor input stage in which regenerative feedback in a predetermined range is used to reduce the input admittance of the neutralizer.

A further object of the invention is to provide an amplifier circuit having a high impedance employing regenerative feedback to neutralize the input resistance and capacitance of the circuit.

An additional object of the invention is to provide a circuit for raising the input impedance and voltage conversion efficiency of a field effect transistor.

Figure 2:
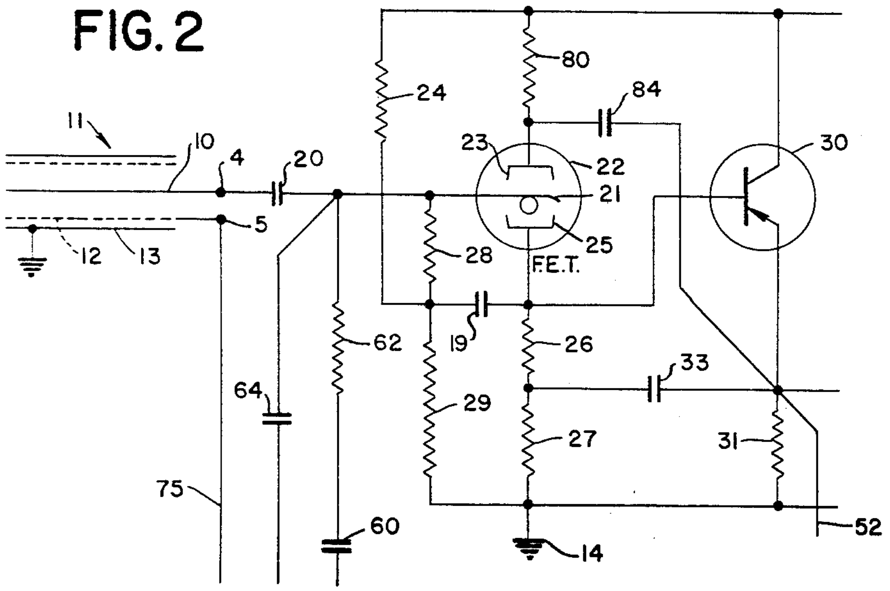
Figure 3:
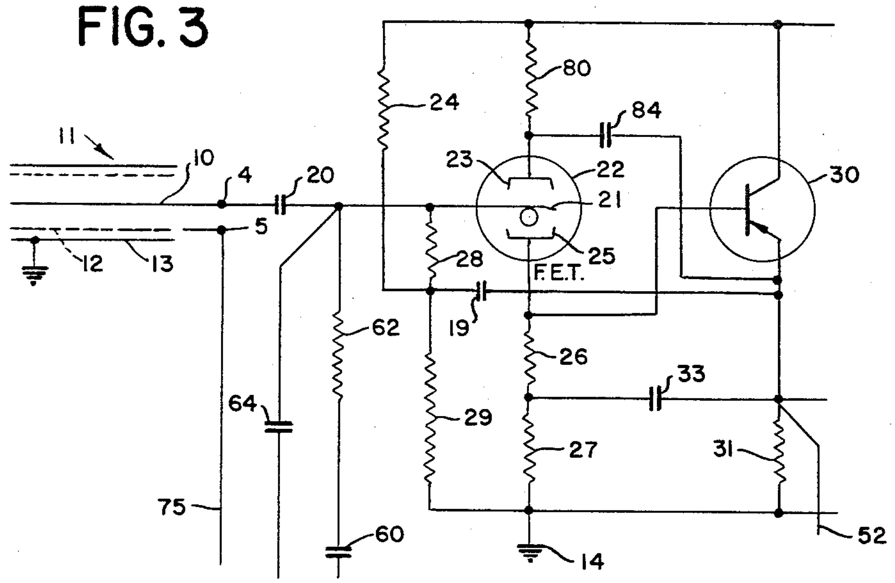

Other objects and advantages of the present invention will become more apparent upon reference to the following specification and annexed drawings in which;

FIGURE 1 is a schematic diagram of a preferred embodiment of the present invention; and FIGURES 2 and 3 are schematic diagrams of other types of circuit arrangement for raising the voltage conversion efficiency ratio of a field effect transistor.

In FIGURE 1 the admittance neutralizer circuit is shown having input terminals 4 and 5 and output terminals 6 and 7. The input terminals 4 and 5 are to be connected to any suitable source (not shown) whose output signal is to be measured or conveyed to another piece of electronic equipment. The output terminals 6 and 7 of the circuit are to be connected to the input of a measuring device such as a vacuum tube voltmeter or an oscilloscope or to the input of another piece of electronic equipment.

Where an input cable 11 is to be used with the neutralizer, the input terminal 4 is connected to the central conductor 10 of the cable. For reasons described below, cable 11 has inner and outer shields 12 and 13. Input terminal 5 is connected to the inner cable shield 12 while the outer shield 13 is connected to a suitable source of reference potential such as ground 14. If the device is to be used without the cable 11, the input signal from the source is applied directly to one end of a capacitor 20 which is connected to terminal 4. In this case terminal 5 would be disconnected, for example, by using a jack which is opened only when the cable is used.

The other end of capacitor 20 is connected to the gate or control electrode 21 of a high input resistance semiconductor device such as field effect transistor 22. The field effect transistor has a source electrode 25 which is connected to the reference potential point 14 by the unbypassed series connected load resistors 26 and 27. The drain electrode 23 of transistor 22 is connected directly to a suitable source of biasing potential called a B-supply (not shown) which may be a battery. Bias for the gate electrode 21 is supplied from the B-source through a voltage divider network formed by resistors 24, 28 and 29.

The field effect transistor 22, and the other transistors of the circuit, are illustratively shown as being of the PNP type, thereby necessitating the use of the B-supply voltage. It should be understood that NPN transistors or any combination of PNP and NPN transistors can be used simply by using the proper biasing arrangements.

As is known, a field effect transistor has a fairly high input resistance in the megohm range and a very low input capacity. The device also has low noise properties and behaves somewhat like a low-voltage vacuum tube. A typical type of field effect transistor usable with the present invention has a bar of p-type semiconductor material, such as silicon, which has n-type impurities introduced into regions on opposite sides of the bar. This creates np junctions and forms a p-type channel between the two n-type regions. Contacts are made at the opposite ends of the bar to serve as the source and drain electrodes while the n-type regions become the gate or control electrodes. The application of a reverse bias to the gate electrode develops an internal electrical field which limits current flow between the source and drain electrodes. Since the gate electrode is reversed biased it presents a high input impedance to the external signal source.

The field effect transistor 22 is operated in a configuration comparable to an emitter follower amplifier configuration of a conventional transistor. The input signal is applied to the gate electrode 21, corresponding to a conventional transistor base electrode, and the output signal is taken across the source resistors 26 and 27, corresponding to the emitter resistors of a conventional transistor emitter follower. It should be noted that source resistor 26 is unbypassed. Due to the amplifier circuit 22 configuration the gain of the field effect transistor is less than one and the polarities of the input and output signals are the same, as would be the case with a conventional emitter-follower transistor amplifier. Actually, because of the feedback or bias pampering arrangement employed, the gain (G) of stage 22 approaches close to unity so that the output signal across resistors 26 and 27 is close to the amplitude of the input signal. Also, as is the case with a conventional emitter-follower, the input impedance of amplifier 22 is relatively high. Since the source resistor 26 is left unbypassed a substantial degenerative effect is produced to further increase the input resistance of transistor 22.

The output signal from the source electrode 25 across resistors 26 and 27 is directly coupled to the base electrode of a transistor impedance converter stage 30 operated as an emitter follower. The collector electrode of transistor 30 is connected directly to the B-supply, while an unbypassed resistor 31 returns the emitter electrode to ground. Transistor 30 produces the same polarity output signal as input signal across emitter resistor 31.

To pamper one of the bias circuits of the field effect transistor 22, the A.C. component of the output signal of stage 30, across resistor 31, is coupled back across resistor 27 to the source electrode 25 of transistor 22 by a capacitor 33. Since the polarity of the A.C. signal coupled back by capacitor 33 is the same as that of the signal on source electrode 25, resistor 26 has an in phase version of the same signal on both of its ends. This effectively increases the A.C. resistance of resistor 26 and further increases the voltage conversion efficiency (gain) of stage 22. The amount of increase of A.C. resistance of resistor 26 is the ratio of 100% of the voltage conversion efficiency of emitter follower stage 30, the source of feedback signal for resistor 26 to its actual signal loss. For example, if transistor 30 has 99% voltage conversion efficiency, a 1% signal loss, the ratio is 100%/1% and the A.C. resistance of resistor 26 is increased 100 times.

A similar pampering technique is used to increase the A.C. resistance of the gate electrode biasing resistor 28. Here, an A.C. feedback signal is provided by capacitor 19 from the upper end of source resistor 26 to the lower end of resistor 28. This feedback signal is of the same phase as the input signal appearing at the upper end of resistor 28. Thus, the A.C. resistance of resistor 28 is increased by the same ratio previously described. Due to the use of the bias pampering techniques described, the input impedance of transistor 22 is increased. In other words it also raises the voltage conversion efficiency of field effect transistor 22. In practice, the voltage conversion efficiency of transistor 22 has been raised from normal values of about 75% or 80%, in follower configuration, to values in the order of 96%–98%.

It should be understood that since transistor 30 is operated as an emitter follower its gain (G) is less than one. Also, transistor 30 has a relatively high input impedance and a relatively low output impedance, as is common with emitter-follower amplifiers of this type. The two transistors 22 and 30 produce an output signal whose amplitude is slightly less than the amplitude of the input signal to transistor 22. In practice the overall gain of cascaded transistors 22 and 30 is preferably made about 98% of the input signal. Other suitable gain figures may be used for the transistors as needed. The amplitude of the output signal across resistor 31 remains highly stable, primarily due to the circuit arrangements used with the two transistors. As explained before, the output impedance of transistor 30 is relatively low.

The output signal at the emitter of transistor 30 is applied through a capacitor 37 to the upper end of a resistor 38 connected to the emitter electrode of a transistor 35. The other end of resistor 38 is grounded. Transistor 35 operates as a common base connected amplifier. The collector of transistor 35 is connected to the B-source by a resistor 39.

The output signal at the collector electrode of transistor 35 is applied through a direct connection to the base electrode of transistor 45. Transistor 45 also operates as an emitter follower amplifier. The collector electrode of transistor 45 is directly connected to the B-source, and emitter resistors 46 and 47 are serially connected between the emitter electrode and the reference potential point 14. A resistor 48 is connected between the emitter of transistor 45 and the base of transistor 35 to establish a D.C. operating bias in conjunction with resistor 40 for the base of transistor 35. The base of transistor 35 is returned to ground by the biasing resistor 40.

In order to establish a definite gain for transistor 35, such as 1.5 or 2 or higher, a signal from the emitter output of transistor 45 is applied back to the base of transistor 35 by a capacitor 50 connected between the junction of emitter resistors 46 and 47 and the base of transistor 35. It should be understood that the signal polarity at the junction of the two resistors is the same as the polarity of the input signal applied to the emitter of transistor 35. Thus, the feedback signal applied to transistor 35 is degenerative, and it aids in setting the gain for the transistor. The overall gain for transistor 35 is controlled by the feedback signal which is in turn determined by the ratio of resistor 46 divided by the sum of resistors 46 and 47.

Even though transistor 45 is an emitter follower stage, the magnitude of the output signal at its emitter is larger than the input signal at the emitter of transistor 35 by virtue of the amplification accomplished by the latter transistor. In practice, the output signal at the emitter of transistor 45 is made somewhere around 1.5 to 2 times greater than the input signal at terminals 4 and 5. Other suitable gain figures may be used as desired. The common base, emitter follower arrangement of amplifiers 35 and 45 also provides a stable reference voltage at the emitter of transistor 45. Thus, two stable reference voltages are established, the first at the emitter of transistor 30 and the second at the emitter of transistor 45.

The output signal at the emitters of emitter-follower transistors 30 and 45 are coupled by lines 52 and 53 to the upper and lower terminals of three parallel connected voltage divider networks 55, 56 and 57. Each of these networks has an adjustable tap for selecting a desired amount of signal. It should be recognized that the signals on lines 52 and 53 are of the same polarity and phase but differ in magnitude. The magnitude of the signal on line 52 at the upper ends of the voltage dividers is less than that of the input signal since it is developed by the two series connected emitter-followers 22 and 30. The magnitude of the signal on line 53 at the lower ends of the voltage dividers is greater than that of the input signal by a factor determined by the gain of transistor 45. Thus there is present across each of the networks 55, 56 and 57 an in phase replica of the input signal at terminals 4 and 5. The magnitude of the signal on networks 55, 56 and 57 is in a range determined at the low end by the gain of stages 22 and 30 and at the high end by the gain of amplifier stages 35 and 45. In the preferred example being described there is available across each of these networks a voltage in the range between about 98% to between about 150%–200% of the input signal. As pointed out before, other suitable gain figures for the amplifiers may be used to change these ranges.

The admittance components at the input of the entire amplifier circuit are further reduced by applying regenerative feedback from networks 55 and 56 back to the gate electrode 21 to unload the input admittance components produced by the input signal. Low frequency regenerative feedback is applied from network 55 through a relatively large value capacitor 60 and series connected resistor 62 to the gate electrode 21. Since the regenerative feedback signal is in phase with the input signal at the end of capacitor 20 connected to input terminal 4, the current through capacitor 20 at low frequencies can be effectively cancelled because, if there is no potential difference on the two terminals of the capacitor then no current can flow therethrough. If there is no signal current flowing through capacitor 20 to the gate electrode at low frequencies, then the circuit loading effect produced by the input signal current normally appearing across resistors 28 and 29 to reduce the amplitude of the signal applied to the gate electrode is eliminated. The amount of the low frequency regenerative feedback is controlled by moving the slider of network 55.

In a similar manner, higher frequency regenerative feedback is applied from the network 56 through a capacitor 64 to the gate electrode 21. This regenerative feedback signal operates in a similar manner to unload the higher frequency signal currents. This effectively reduces the shunt capacitance at the input of the field effect transistor. The shunt capacitance can be reduced to zero and even to values which are negative. The latter can be used to compensate for and cancel out stray shunt capacitances introduced by components external to the amplifier circuit.

By using regenerative feedback at the high and low ranges of input signal frequencies the remaining admittance at the input of the field effect transistor is effectively "mopped up." When it is considered that the field effect transistor has an inherently high input impedance, which is further raised by the degenerative feedback and bias pampering techniques previously described, then it should be clear that the circuit has an extremely low input admittance. For all practical purposes the input admittance may be considered as being close to zero. It also may be made negative if desired by increasing the feedback signals to the gate electrode 21. Thus, the circuit has an extremely high input impedance which will not load other circuits under test and, in fact, when the admittance is made negative, can even be used to compensate for external impedances.

It should be understood that the circuit is prevented from oscillating by using regenerative feedback at the input of the field effect transistor only in a carefully controlled range and by operating the field effect transistor and other transistors in the circuit with stabilizing feedback. In the preferred operating mode of the present circuit the amount of regenerative feedback, and particularly that applied through capacitor 64, is adjusted so that the circuit will not break into oscillation.

In a preferred embodiment of the invention it is desired that the entire circuit of FIGURE 1 operate to produce precise unity gain, i.e., the amplitudes of the input and output signals should be the same. To accomplish this an emitter follower post amplifier 70 is provided whose base input signal is taken off across network 57 by the slider arm of the potentiometer. This slider arm is normally set to a position so that the output signal appearing across emitter resistor 71 is of the same magnitude as the signal at input terminals 4 and 5. The emitter follower 70 has a relatively low output impedance and the output signal is coupled through capacitor 72 to the output terminal 6. Resistor 73 connected between output terminal 6 and ground 14 bleeds off the D.C. component of the output signal resistor 73. Thus, an equal amplitude same phase replica of the input signal is available across terminals 6 and 7 by adjusting the slider of network 57, for application to another device such an oscilloscope or vacuum tube voltmeter.

When a cable 11 is used, the capacity of the cable is balanced out by taking a unity gain replica of the input signal from the output terminal 6 and applying this signal over line 75 back to the inner shield 12 of the cable. If the amplifier 70 is adjusted for unity gain by the network 57 then the inner shield 12 carries an accurate duplicate of the input signal and the capacity between the inner shield and the central conductor of the cable is effectively made zero. This is so because any capacitor which is fed completely identical signals into each of its two terminals cannot carry any current since there is no differential signal voltage between the two terminals. Also, any circuit element which does not carry a current while a signal voltage is applied to one of its input terminals behaves as though it were intermittent, in this case as if the cable capacity between the center conductor and the inner shield were zero. It should be understood that the slider of network 57 can be adjusted to tap off any voltage in the range available. This means that the capacity of the cable can be changed as desired. In the latter case a separate emitter-follower and voltage divider network (not shown) can be used to obtain a unity gain output signal for terminals 6 and 7.

FIGURE 2 shows a modified circuit for the field effect transistor stage 22 and the emitter-follower 30. This circuit is designed to further pamper the field effect transistor to increase its voltage conversion efficiency. In FIGURE 2 the same reference numerals have been used as in FIGURE 1, where applicable. The circuit of FIGURE 2 is similar to that of FIGURE 1 with respect to the A.C. feedback signals applied back to the gate and source electrodes over capacitors 19 and 33. The drain electrode is now provided with a resistive load in the form of resistor 80 whose upper end is connected back to the B-supply. A capacitor 84 is connected between the upper end of transistor 30's emitter load resistor 31 at the drain electrode 23. Capacitor 84 forces an in phase signal on drain electrode 23 thereby greatly reducing the "Miller effect" between it and gate electrode 21. This results in a further increase in the input impedance of transistor 22. This further raises the voltage conversion efficiency of field effect transistor 22.

FIGURE 3 shows a modified version of the circuit of FIGURE 2. Here, the A.C. feedback signal for the gate biasing resistor 28 is provided by capacitor 19 from the emitter resistor 31 of transistor 30. This differs from FIGURE 2, in which the A.C. feedback signal is taken from the upper end of source electrode biasing resistor 26.

While the A.C. pampering signals for the field effect transistor biasing resistors 26, 28 and 80 have been described as being as less than unity gain with respect to FIGURES 1, 2 and 3, it should be understood that a greater than unity gain signal may also be used. This greater than unity gain signal can be taken, for example, from the emitter of transistor 45 or any other suitable place in the circuit. The use of a greater than unity gain signal has also been found to increase the input impedance and voltage conversion efficiency of transistor 22.

It should be understood that the pampering techniques described in FIGURES 1, 2 and 3 can be used on one, two or three of the electrodes of the field effect transistor. Doing this on one or more of the electrodes increases the voltage conversion efficiency of the transistor.

The admittance neutralizer circuit of the present invention can use high impedance input amplifier stages other than the field effect transistor previously described. For example, an electrometer tube can be substituted for the field effect transistor as well as a high input impedance vacuum tube. In all such cases using the different amplifier devices, the regenerative neutralizing and bias pampering techniques previously described may be utilized in the manner previously described. It should also be understood that the regenerative neutralizing feedback technique will also benefit klystron and magnetron tubes if only neutralization of capacitive effects is required.

The bias pampering techniques previously described with respect to the field effect transistor may also be used with common junction transistors. It has been found that by using these pampering techniques the normal one to two thousand ohms input impedance of a junction transistor may be raised to several hundred megohms.

Therefore, it can be seen that a novel amplifier circuit has been provided which uses techniques to make the circuit have effectively zero input admittance. Thus the circuit can be used in many applications where it is desired to couple a high impedance output source to a relatively low impedance input source, the present circuit serving to prevent loading and to produce an exact replica of the input signal.

Although a particular structure has been described, it should be understood that the scope of the invention should not be limited by the particular embodiments of the invention shown by way of illustration, but rather by the appended claims.

What is claimed is:

1. An admittance neutralizer circuit for presenting a low input admittance to an input signal comprising:

amplifying means having a normal relatively high input impedance, said amplifying means also including; input means for receiving said input signal, output means, and at least one biasing means, first and second amplifier means, means connecting said first and second amplifier means in series with said output means so that one of said first and second amplifier means produces a less than unity gain version of said input signal and the other amplifier means produces a greater than unity gain version of said input signal, a voltage divider network connected between the outputs of said first amplifier and second amplifier means, and means connected between said voltage divider means and said input means of said amplifying means for feeding back a regenerative version of the signal current of said input signal to said input means.

2. An admittance neutralizer circuit as set forth in claim 1 wherein said voltage divider network is variable to adjust the regenerative feedback signal current applied to said input means between two extremes, one of which is greater and the other of which is smaller than the input signal current supplied to the input of said amplifying means.

3. An admittance neutralizer as set forth in claim 1 further comprising means connected to one of said first and second amplifier means and to one of said biasing means of said amplifying means for applying a regenerative version of the input signal to said one biasing means.

4. A feedback circuit as set forth in claim 1 wherein said amplifying means comprises a field effect transistor having source, gate and drain electrode means, and said means for feeding back a regenerative version of the signal current is connected to said gate means.

5. A feedback circuit as in claim 4 further comprising biasing means connected to said source electrode means, and means connected between one of said first and second amplifier means and to said biasing means for applying a regenerative version of the input signal to said biasing means.

6. An admittance neutralizer circuit for presenting a low input admittance to an input signal comprising:

amplifying means having a normal relatively high input impedance, said amplifying means also including; input means for receiving said input signal, output means, and at least one biasing means, first and second amplifier means, means connecting said first and second amplifier means in series with said output means so that one of said first and second amplifier means produces a less than unity gain version of said input signal and the other amplifier means produces a greater than unity gain version of said input signal, first means connected to said first and second amplifier means and to said input means for feeding back a regenerative version of the signal current of said input signal to said input means, impedance converter means, and second means connected to said first means and to said impedance converter means for applying said signal at said first means to said impedance converter means.

7. An admittance neutralizer circuit for presenting a low input admittance to an input signal comprising:

amplifying means having a normal relatively high input impedance, said amplifying means also including; input means for receiving said input signal, output means, and at least one biasing means, first and second amplifier means, means connecting said first and second amplifier means in series with said output means so that one of said first and second amplifier means produces a less than unity gain version of said input signal and the other amplifier means produces a greater than unity gain version of said input signal, said first and second amplifier means, said voltage divider having a variable output control means connected to said input means of said amplifying means for feeding back a regenerative version of the signal current of said input signal to said input means which varies between two extremes, one of which is greater and the other of which is smaller than the input signal current supplied to the input of said amplifying means, output impedance converter means, and means connected to said voltage divider network having a variable voltage output control connected to said impedance converter means for adjusting the input signal of said output impedance converter means between two extremes, one of which is smaller and one of which is greater than the magnitude of the input signal applied to the input circuit of said amplifying means, said output impedance converter means producing an output signal whose magnitude is selectable between less than unity gain and greater than unity gain as compared to the input signal.

8. An admittance neutralizer circuit as set forth in claim 7 having an input cable connected to said input means, said cable also having a shield connected to said output impedance converter means for receiving the output signal therefrom.

9. A feedback circuit comprising:

amplifying means having output means and input means for receiving an input signal, first and second amplifier means, means connecting said first and second amplifier means in series with said output means so that one of said first and second amplifier means produces a less than unity gain version of said input signal and the other amplifier means produces a greater than unity gain version of said input signal, a voltage divider network connected between the outputs of said first means and said second amplifier means, and means connected between said voltage divider means and said amplifying means for feeding back a portion of the signal thereacross to said amplifying means.

10. A feedback circuit comprising:

amplifying means having a normal relatively high input impedance, said amplifying means also including; input means for receiving said input signal, output means, and at least one biasing means, first and second amplifier means, means connecting said first and second amplifier means in series with said output means so that one of said first and second amplifier means produces a less than unity gain version of said input signal and the other amplifier means produces a greater than unity gain version of said input signal, a voltage divider network connected between said first and second amplifier means, said voltage divider having a variable output control means connected to said input means of said amplifying means for feeding back a version of the signal current of said input signal to said amplifying means which is selectable between two extremes, one of which is greater and the other of which is smaller than the input signal current supplied to the input of said amplifying means, output impedance converter means, and means connected to said voltage divider network having a variable voltage output control connected to said impedance converter means for adjusting the input signal of said output impedance converter means between two extremes, one of which is smaller and one of which is greater than the magnitude of the input signal applied to the input circuit of said amplifying means, said output impedance converter means producing an output signal whose magnitude is selectable between less than unity gain and greater than unity gain as compared to the input signal.

References Cited

UNITED STATES PATENTS

| | | | |
|---|---|---|---|
| 3,100,876 | 8/1963 | Schulz | 330—17 |
| 3,121,201 | 2/1964 | Bernstein-Bervery et al. | 330—17 X |

OTHER REFERENCES

Bignell: "How To Get Maximum Input Impedance With Field-Effect Transistors," Electronics, Mar. 8, 1963, pp. 44–46.

ROY LAKE, *Primary Examiner.*

NATHAN KAUFMAN, *Examiner.*

R. P. KANANAN, J. B. MULLINS, *Assistant Examiners.*

UNITED STATES PATENT OFFICE

CERTIFICATE OF CORRECTION

Patent No. 3,379,987 April 23, 1968

Walter K. Volkers

It is certified that error appears in the above identified patent and that said Letters Patent are hereby corrected as shown below:

Column 6, line 18, after "such" insert -- as --. Column 8, between lines 43 and 44, insert -- a voltage divider network connected between --.

Signed and sealed this 9th day of September 1969.

(SEAL)
Attest:

Edward M. Fletcher, Jr.
Attesting Officer

WILLIAM E. SCHUYLER, JR.
Commissioner of Patents